US007369067B2

United States Patent
Kishi et al.

(10) Patent No.: US 7,369,067 B2
(45) Date of Patent: May 6, 2008

(54) OPTICAL COUPLED TYPE ISOLATION CIRCUIT

(75) Inventors: Motoharu Kishi, Kanagawa (JP); Atsushi Iwata, Hiroshima (JP); Yoshitaka Murasaka, Hiroshima (JP); Toshifumi Imamura, Hiroshima (JP); Sadao Igarashi, Kanagawa (JP); Kouichi Kobinata, Kanagawa (JP)

(73) Assignee: NEC Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 11/404,119

(22) Filed: Apr. 14, 2006

(65) Prior Publication Data

US 2006/0279438 A1    Dec. 14, 2006

(30) Foreign Application Priority Data

Apr. 18, 2005    (JP)    ............................. 2005-119232

(51) Int. Cl.
    *H03M 5/08*    (2006.01)
(52) U.S. Cl. .......................................... 341/53; 341/71
(58) Field of Classification Search .................. 341/53, 341/71; 375/361
    See application file for complete search history.

(56) References Cited

U.S. PATENT DOCUMENTS

| | | | |
|---|---|---|---|
| 3,967,061 A * | 6/1976 | Dobias | 375/361 |
| 4,002,834 A * | 1/1977 | Cocci et al. | 375/362 |
| 4,806,907 A | 2/1989 | Furgason | |
| 5,287,107 A | 2/1994 | Gampell et al. | |
| 5,473,552 A | 12/1995 | Chen et al. | |
| 5,930,303 A | 7/1999 | Walker | |
| 6,323,796 B1 | 11/2001 | Krone et al. | |
| 6,775,323 B1 | 8/2004 | Vasudevan Pillai et al. | |
| 2002/0105377 A1 * | 8/2002 | Masuda et al. | 330/10 |

FOREIGN PATENT DOCUMENTS

| EP | 0 573 156 A1 | 12/1993 |
|---|---|---|
| EP | 1 235 400 A1 | 8/2002 |

OTHER PUBLICATIONS

European Search Report dated Aug. 2, 2006.
European Search Report dated Dec. 12, 2006.

* cited by examiner

*Primary Examiner*—Jean Bruner Jeanglaude
*Assistant Examiner*—Joseph Lauture
(74) *Attorney, Agent, or Firm*—McGinn IP Law Group, PLLC

(57) ABSTRACT

In an optical coupled isolation circuit, a PWM encoder encodes a one-bit binary data signal supplied from a sigma-delta analog-digital converter in synchronization with a clock signal of a cycle T to produce a pulse width modulation signal. The pulse width modulation signal includes a narrower pulse having a width of 1/T and a wider pulse having a width of 3/T according to binary codes "0" and "1". The pulse width modulation signal is transmitted to a decoder as a recovered pulse width modulation signal through a light emitting device, a light detector and an optical recovery circuit. A decoder decodes the recovered pulse width modulation signal at timing of a half of the clock cycle from each rising edge of the recovered pulse width modulation signal. The rising edge is synchronized with the clock signal. Thus, the clock signal and the data signal can be transmitted in one channel.

10 Claims, 7 Drawing Sheets

OPTICAL COUPLED TYPE ISOLATION CIRCUIT

This application claims priority to prior application JP 2005-119232, the disclosure of which is incorporated herein by reference.

BACKGROUND OF THE INVENTION

This invention relates to an optical coupled type isolation circuit which is used to transmit an analog signal with high accuracy from an input part to an output part in a state that the input part and the output part are electrically isolated from each other. In particular, this invention relates to an optical coupled type isolation circuit capable of reliable transmission of a one-bit data signal together with a clock signal easily.

An existing isolation circuit, e.g. an isolation amplifier, is used in various places, such as a factory, a plant, a hospital providing medical instruments, or the like to remove large common mode noises and/or to secure safety. The large common node noises are frequently caused at a place, e.g. the factory or the plant, where high power apparatuses and high sensitive electronic devices, which have different source voltages of over 1000 volts, are arranged close to one another.

A type of the isolation amplifier using a photo coupler transmits a signal in a form of light and thereby obtains electrical isolation between input and output parts thereof. Accordingly, the type of the isolation amplifier using the photo coupler is superior to a type of the isolation amplifier using an electromagnetic coupling in resistance to noises.

The isolation amplifier using the photo coupler, for example, is provided between a motor (or an AC servo, or an inverter for the motor) and a precision instrument, such as a microcomputer as a controller for the motor, in the factory or the plant to control the motor with high accuracy.

To improve accuracy and to reduce a cost of the isolation amplifier, a sigma-delta modulation is employed in an optical isolation amplifier. However, the optical isolation amplifier can not transmit a clock signal from an input part to an output part thereof, even if the clock signal is necessary in the output part.

Such an optical isolation amplifier is disclosed in U.S. Pat. No. 5,287,107 or Japanese Patent Publication No. 3174200.

As another exiting isolation circuit, there is a digital-analog (D/A) converter which adopts a pulse width modulation method.

The D/A converter converts input digital data into a pulse width modulation signal. The pulse width modulation signal is transmitted from an input part to an output part through a photo coupler. In the output part, the pulse width modulation signal is converted into an analog signal.

However, the D/A converter has a problem that jitters are caused to rising edges and falling edges of a light signal in the photo coupler and superimposed on the analog signal.

Such a D/A converter disclosed in Unexamined Japanese Patent Publication No. 6-209261.

SUMMARY OF THE INVENTION

It is therefore an object of this invention to provide an optical coupled type isolation circuit capable of transmitting a clock signal together with a one-bit binary data signal from an input part to an output part.

Another object of this invention is to provide an optical coupled type isolation circuit capable of transmitting an analog signal with high accuracy.

Other objects of this invention will become clear as the description proceeds.

According to an aspect of this invention, a binary data encoding circuit comprises an input terminal to receive one-bit binary data signal. An encoding portion is connected to the input terminal to encode the one-bit binary data signal in a predetermined cycle T. An output terminal is connected to the encoding portion to output an encoded signal. The encoding portion adopts a pulse width modulation method to produce two pulses which have different widths according to binary codes "0" and "1" of the one-bit binary data signal.

According to another aspect of this invention, a binary data decoding circuit is for decoding an encoded signal which is obtained by encoding one-bit binary data signal in a predetermined cycle T and by means of a pulse width modulation method. The binary data decoding circuit comprises an input terminal to receive the encoded signal. A decoding portion is connected to the input terminal to decode the encoded signal. An output terminal is connected to the decoding portion to output a decoded signal. The decoding portion discriminates binary codes "0" and "1" according to a level of the encoded signal at timing of a half of the predetermined cycle T from each rising edge of the encoded signal.

According to further still another aspect of this invention, an optical coupled type isolation circuit comprises a sigma-delta analog-digital converter for converting an input analog signal into a one-bit binary data signal. An encoder is connected to the sigma-delta analog-digital converter to encode the one-bit binary data signal and produces a pulse width modulation signal which is synchronized with a clock signal for the sigma-delta analog-digital converter. A light emitting device is connected to the encoder and produces a light pulse signal according to the pulse width modulation signal. A light detector is optically coupled with the light emitting device and receives the light pulse signal from the light emitting device to produce a received electrical signal. An optical recovery circuit is connected to the light detector and recovers the pulse width modulation signal from the received electrical signal to produce a recovered pulse width modulated signal. A decoder is connected to the optical recovery circuit and decodes the recovered pulse width modulation signal to produce a decoded one-bit binary data signal and a recovery clock signal.

DESCRIPTION OF THE PREFERRED EMBODIMENT

Figure 1:
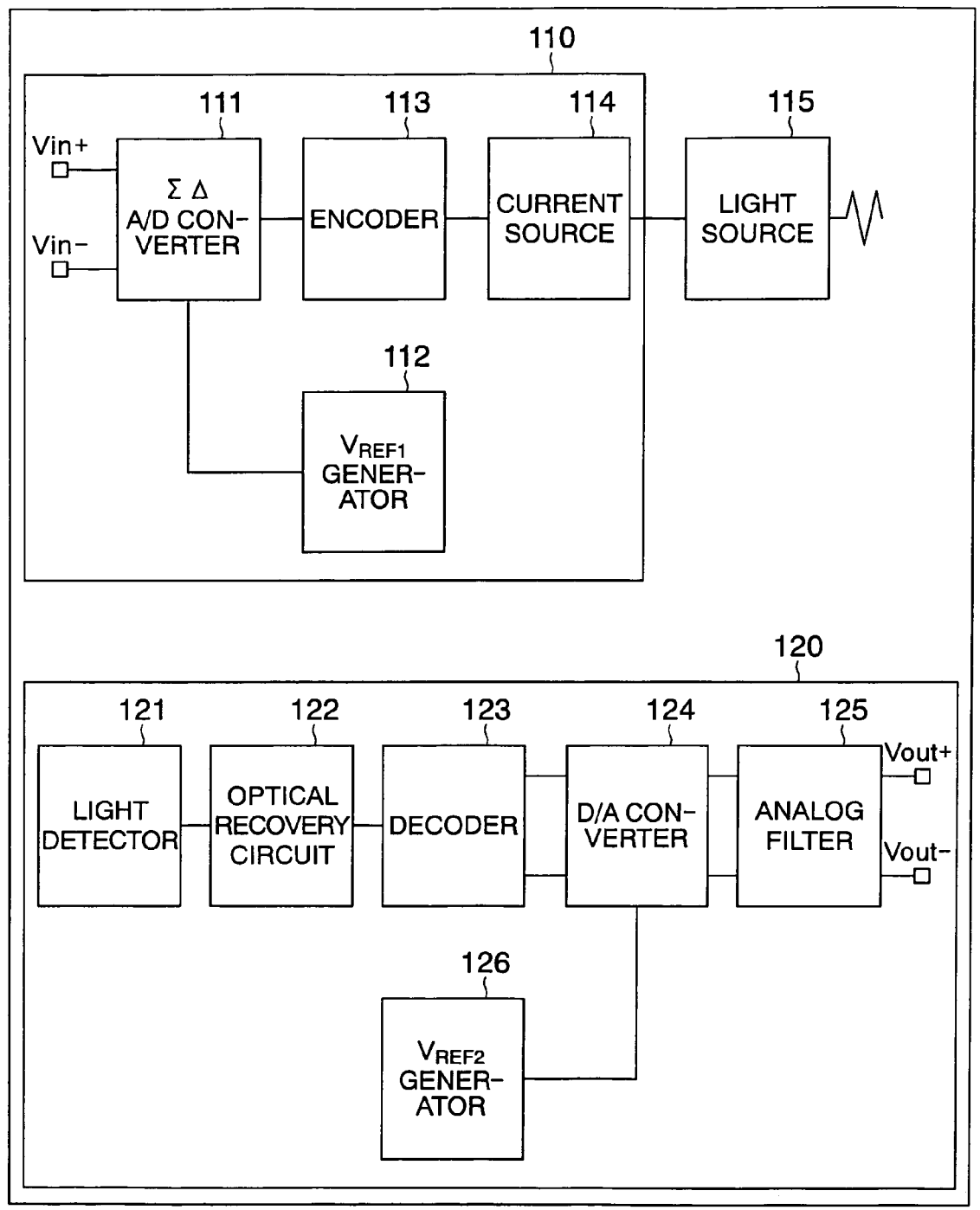
FIG. 1 is a block diagram of an existing optical isolation amplifier.

Referring to FIG. 1, a description will be first directed to an existing optical isolation amplifier with a sigma-delta modulation.

As illustrated in FIG. 1, the optical isolation amplifier has a transmitting part and a receiving part which are depicted at upper and lower sides of FIG. 1, respectively. While the transmitting part includes a transmitting chip 110 and a light source (or a light emitting diode (LED)) 115, the receiving part includes a receiving chip 120. The transmitting chip 110 and the receiving chip 120 are provided as integrated circuits.

An input analog signal is supplied to a sigma-delta analog-digital converter 111 through input pads as a differential voltage signal Vin+ and Vin−.

The sigma-delta A/D converter 111 is connected to a reference voltage generator 112 and receives a reference voltage from a reference voltage generator 112. The sigma-delta A/D converter 111 provides a chopper-stabilized sigma-delta circuit (not shown) and converts the analog signal into a one-bit binary data signal with reference to the reference voltage. The sigma-delta A/D converter 111 supplies the one-bit binary data signal to an encoder 113.

The encoder 113 encodes the one-bit binary data signal into an edge-encoded pulse signal. In other words, the encoder 113 generates a pulse whenever the one-bit binary data signal changes between "0" and "1".

The edge-encoded pulse signal is transmitted to the receiving chip 120 in an optical form through a current source 114 and the light source 115.

The light source 115 forms a photo coupler for one channel together with a light detector 121. The light source 115 emits a light signal corresponding to the edge-encoded pulse signal while the light detector 121 detects the light signal from the light source 115.

In the receiving chip 120, the light detector 121 produces a detected encoded pulse signal according to the light signal. An optical recovery circuit 122 recovers the encoded pulse signal from the detected encoded pulse signal to produce a recovered encoded pulse signal.

The recovered encoded pulse signal is supplied to a decoder 123 and changes a state of a toggle flip-flop circuit (not show) of a decoder 123. The toggle flip-flop circuit does not respond to falling edges of the detected pulse signal but responds to rising edges of the detected pulse signal. Consequently, pulse width distortion of the edge-encoded pulse signal is eliminated from the recovered encoded pulse signal. Thus, the decoder 123 decodes the recovered encoded pulse signal into two decoded signals without influence of the pulse width distortion.

Meanwhile the encoder 113 includes a high-state pulse stretcher (not shown) while the decoder 123 includes a dual one-shot (or two-shot) circuit (not shown). The high-state pulse stretcher and the two-shot circuit allow accurate phases in the decoded signals.

The D/A converter 124 converts the decoded signals into converted signals without clock information. The analog filter 125 filters the converted signals to produce filtered analog signals. The filtered analog signals are supplied output pads as a differential voltage signal Vout+ and Vout−.

Thus, the existing optical isolation amplifier transmits the analog signal from the input part to the output part in a state that the output part is electrically isolated from the input part. However, the existing optical isolation amplifier employing edge encoding can not transmit clock information from the input part to the output part though the output part needs the clock information.

Manchester coding is known as an encoding method which is capable of transmitting a clock signal together with a data signal. However, Manchester code causes jitters when rising edges and falling edges of optical pulses in the optical isolation amplifier are not matched.

Generally, it is necessary to match the rising edges with the falling edges of the optical pulses in the optical transmission system. However, it is difficult to accurately match the rising edges with the falling edges of the optical pulses. This is because an LED deteriorates with time elapse and a receiving circuit of the optical transmission system has a response characteristic varied by intensity of received light. In addition, though a low speed LED is desirable from the viewpoint of cost, Manchester code needs a relatively broadband (or high speed) LED.

In the meantime, there is an existing digital-analog (D/A) converter adopting a photo coupler and a pulse width modulation method.

Figure 2:
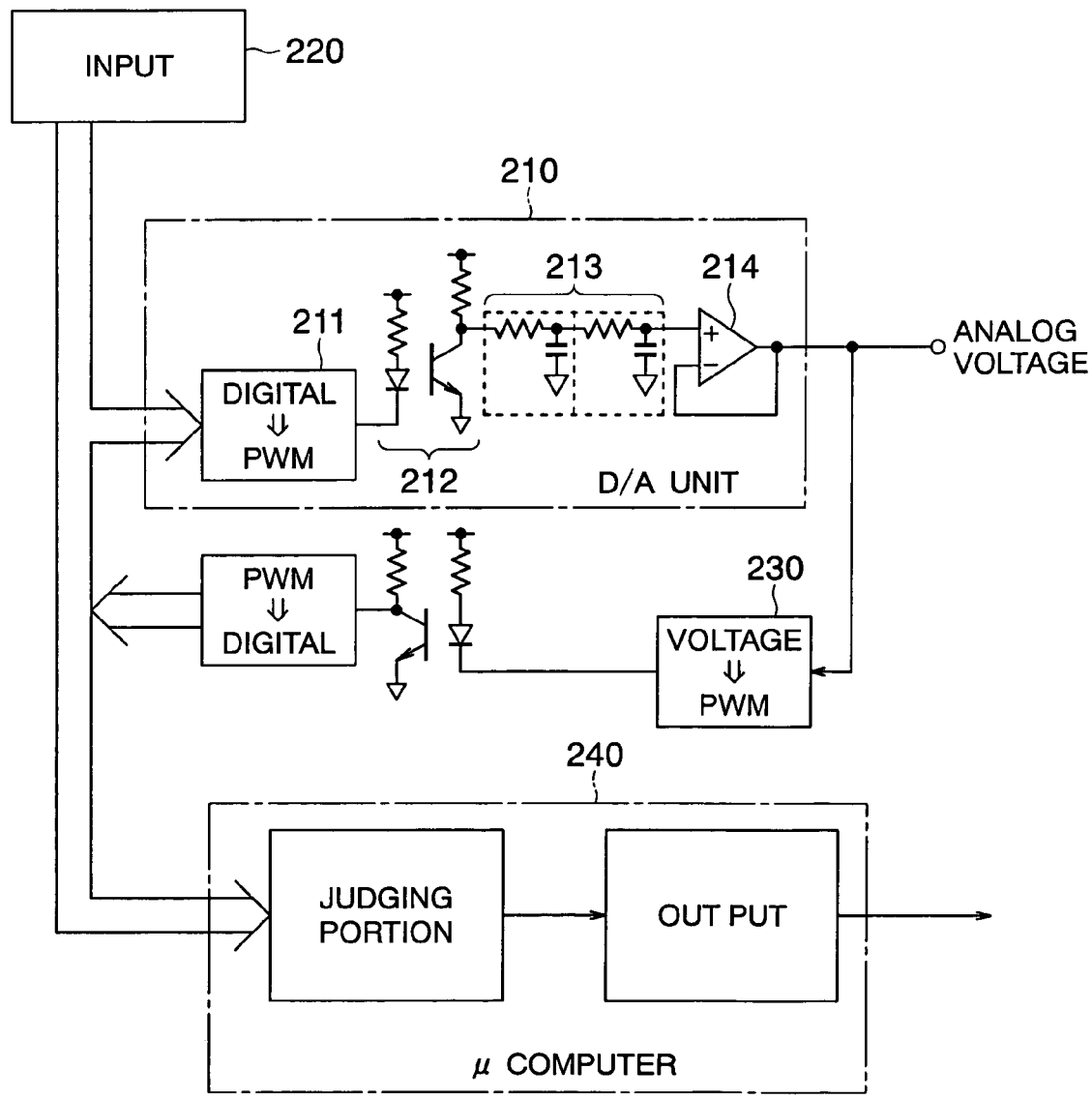
FIG. 2 is a schematic diagram of a existing digital-analog converter employing a pulse width modulation method.

Referring to FIG. 2, the D/A converter has an isolation type D/A converting unit 210. In the D/A converting unit 210, a PWM converter 211 executes pulse width modulation to produce a pulse width modulation (PWM) signal whose pulses having width according to input digital data supplied from an input portion 220. A photo diode of a photo coupler 212 converts the PWM signal supplied from the PWM converter 211 into a light signal while a photo transistor of the photo coupler 212 converts the light signal into a recovered PWM signal. A low pass filter 213 has a smoothing circuit and filters the recovered PWM signal supplied from the photo coupler 212 and to convert it into a direct voltage signal. A buffer amplifier 214 amplifies the direct voltage signal supplied from the low pass filter 213 and outputs it as analog voltage signal.

The D/A converter further includes a pulse width modulation (PWM) portion 230 to produce a feedback signal which is used in a micro computer 240 to confirm that the analog voltage signal is correctly converted. The PWM portion 230 converts the analog voltage signal into a binary data signal by the use of a predetermined reference voltage and converts the binary data signal into a feedback pulse width modulation signal. Thereafter, the feedback PWM signal is converted into a feedback digital signal to be compared with the input digital signal by the micro computer 240.

It seems that the existing D/A converter is useful for an optical coupled type isolator circuit when it is combined with an analog-digital converter. However, the existing D/A converter has a problem that jitters are caused to rising edges and falling edges of the light signal by the photo coupler 212 and superimposed on the direct voltage signal (or the analog voltage signal).

As mentioned below, this invention employs a pulse width modulation method that binary codes "0" and "1" are represented by pulses having different widths. One of the different widths is smaller than a half of a clock cycle T by a predefined offset while the other is larger than the half of the clock cycle T by the predefined offset. The pulses have rising edges which coincide with a clock signal. Accordingly, if discrimination is made at timing of a half of the clock cycle T from each rising edge, the pulses are correctly decoded. The predefined offset is a margin for accuracy of the discrimination. Thus, the PWM method facilitates discrimination of the binary codes "0" and "1" at an output part which is electrically isolated from an input part. The predefined offset and the timing are properly selected to easily obtain stable decoding.

Figure 3:
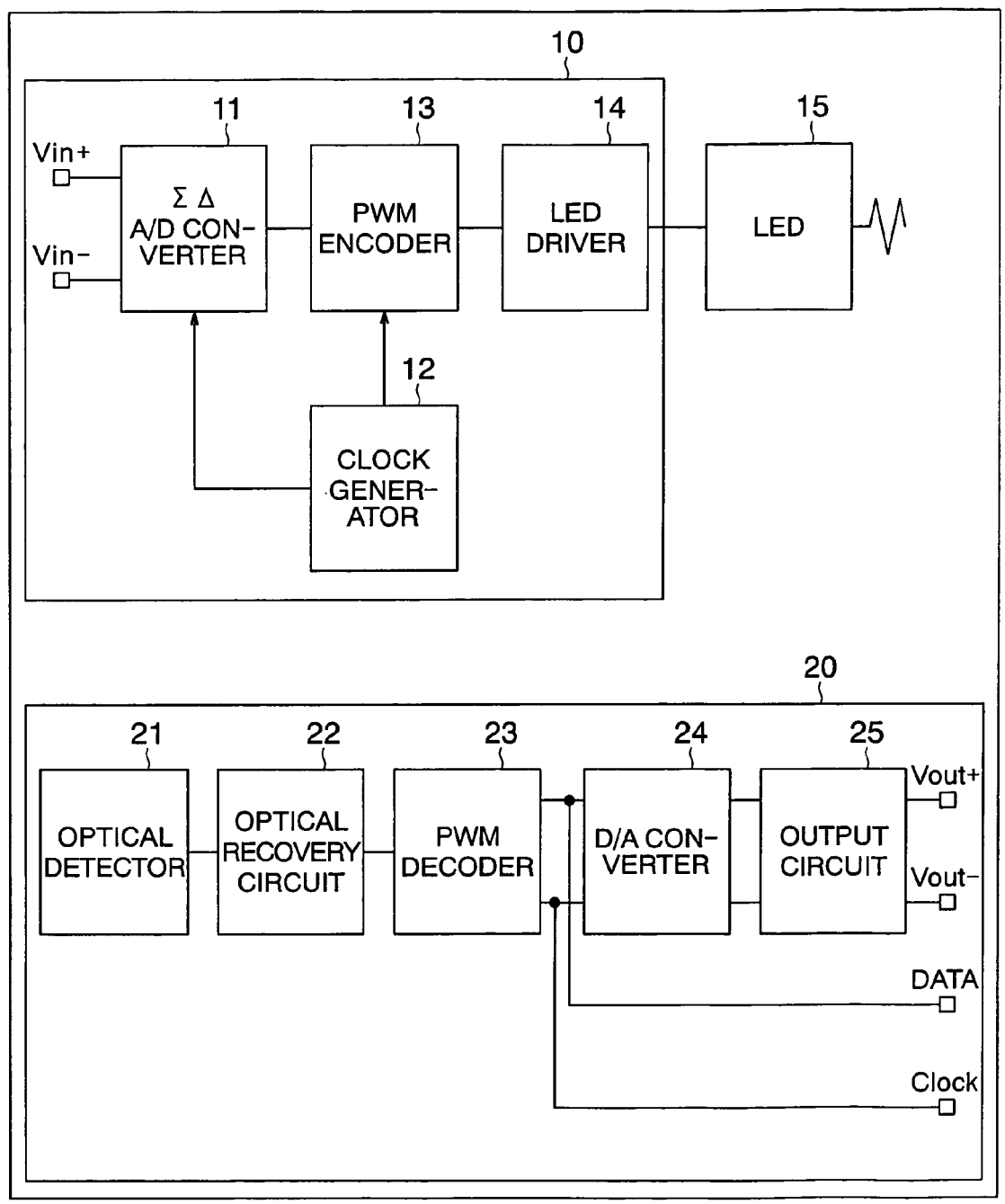
FIG. 3 is a block diagram of an optical coupled type isolation circuit according to a preferred embodiment of this invention.

Referring to FIG. 3, the description will be made of an optical coupled type isolation circuit according to a preferred embodiment of this invention.

The optical coupled type isolation circuit has an input part including a transmitting chip 10 and a light emitting device (LED) 15, and an output part including a receiving chip 20. The input part and the output part are electrically isolated from each other.

The transmitting chip 10 includes input pads Vin+ and Vin−, a sigma-delta analog-digital converter 11 (hereinafter abbreviated to an A/D converter) which is connected to the input pads, a clock generator 12 which is connected to the A/D converter 11, a pulse width modulation (PWM) encoder 13 which is connected to the A/D converter 11 and the clock generator 12, and a LED driver 14 which is connected to the PWM encoder 13 and the LED 15.

The receiving chip 20 includes an optical detector 21, an optical recovery circuit 22 which is connected to the detector 21, a PWM decoder (or a delay locked loop (DLL) circuit) 23 which is connected to the optical recovery circuit 22, a digital-analog (A/D) converter 24 which is connected to the PWM converter 23, an output circuit 25 which is connected to the D/A converter 24, analog signal output pads (Vout+ and Vout−) which are connected to the D/A converter 24, and digital signal output pads (DATA and CLOCK) which are connected between the PWM decoder 23 and the D/A converter 24. Though the receiving chip 20 is electrically isolated from the input part as mentioned above, the optical detector 21 is optically coupled with the LED 15 of the input part.

Referring FIG. 4 in addition to FIG. 3, the principal operation of the isolation circuit will be described soon.

Figure 4:
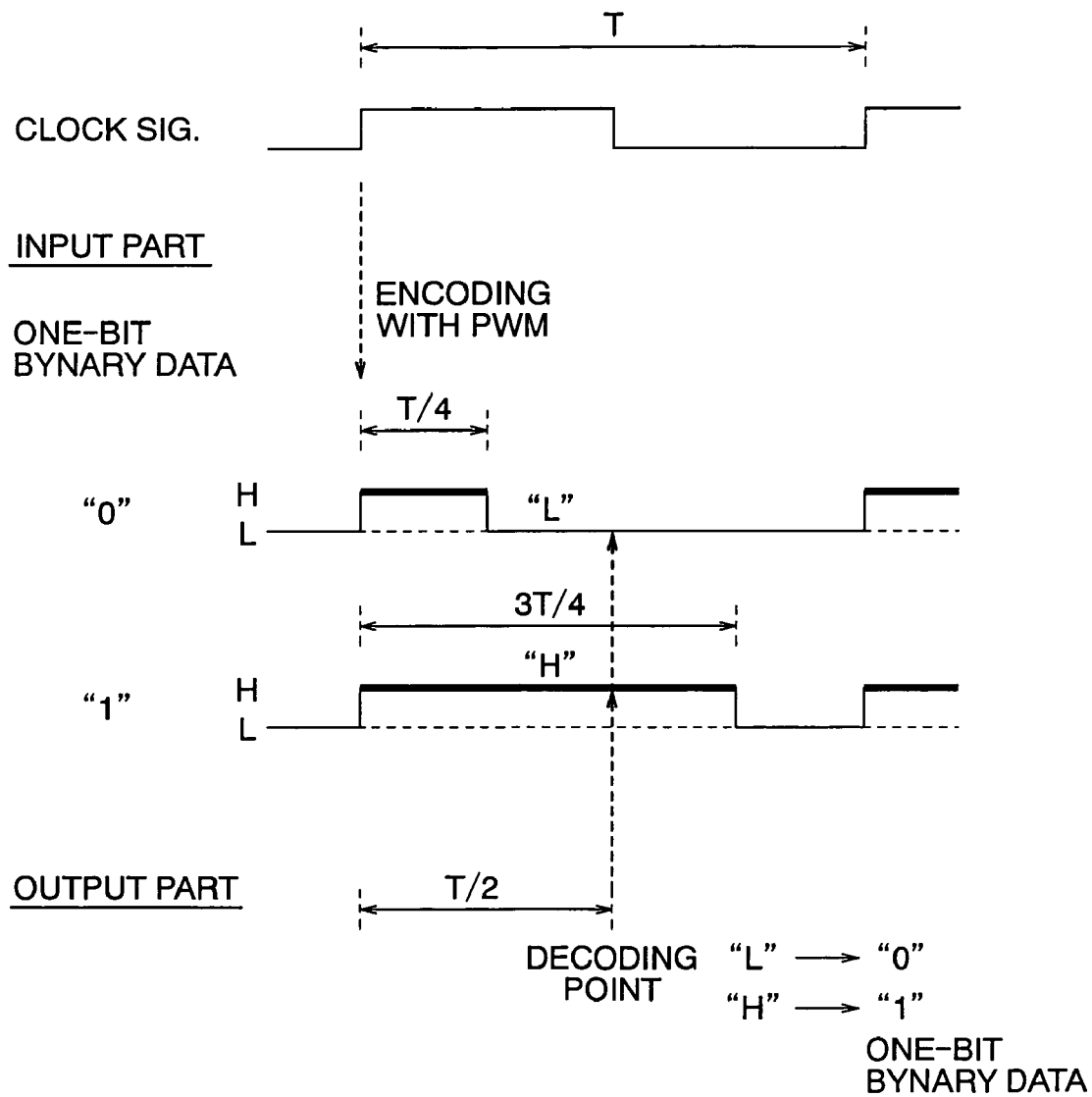
FIG. 4 is a diagram for describing an operation of the optical coupled type isolation circuit of FIG. 3.

As illustrated in FIG. 4, when a clock signal generated by the clock generator 12 has a clock cycle of "T", a pulse width modulation (PWM) signal produced in the transmitting part includes two pulses having different widths according to binary codes "0" and "1". The narrower one of the different width is narrower than the half of the clock cycle "T" by a predefined offset value while the wider one is wider than the half of the clock cycle "T" by the predefined offset value. If the off set value, for example, is equal to a quarter of the clock cycle "T", the binary code "0" and "1" are represented by the width of "T/4" and "3T/4", respectively. The PWM signal has rising edges which are synchronization with the rising edges of the clock signal regardless of the width of the pulses.

Particularly, input analog signals are (or a differential analog signal is) supplied to the sigma-delta A/D converter 11 through the input pads Vin+ and Vin−. The clock signal generated by the clock generator 12 is also supplied to the sigma-delta N/D converter 11. The sigma-delta A/D converter 11 converts the analog signals into a one-bit binary data signal in synchronization with the clock signal. The one-bit binary data signal is supplied to the PWM encoder 13. The PWM encoder 13 simultaneously produces a narrower pulse having the period of "T/4" and a wider pulse having the period of "3T/4" from the clock pulse supplied from the clock generator 12. In addition, the PWM encoder 13 selects either the narrower pulse or the wider pulse according to the one-bit digital binary data signal. That is, the PWM encoder 13 supplies the narrower pulse to the LED driver 14 when the one-bit binary data signal represents the binary code "0". On the other hand, the PWM encoder 13 supplies the wider pulse to the LED driver 14 when the one-bit binary data signal represents the binary code "1".

Thus, the PWM signal output from the PWM encoder 13 has clock information represented by rising edges having the cycle of "T" and data information represented by pulse widths along a time axis. The PWM signal is transmitted from the input part to the output part in a form of light through the photo coupler formed by the LED 15 and the optical detector 21. That is, the LED 15 produces a light pulse signal according to the PWM signal while the optical detector 21 receives the light pulse signal from the LED 15.

As understood from FIG. 4, the PWM signal can be reconverted into a binary data signal by detecting a level ("H" or "L") of the PWM signal at timing of a half cycle "T/2" from each rising edge of the PWM signal. That is, when the PWM signal has a low level "L" at the timing of the half cycle T/2 from the rising edge, a receiving datum is decided to "0". Contrary, when the PWM signal has a high level "H" at the timing of the half cycle "T/2" from the rising edge, the receiving datum is decided to "1". Because each pulse of the PWM signal has a margin of T/4, the decision can be executed with high accuracy.

In Particular, the PWM signal is transmitted to the output part in an optical form. The optical detector 21 detects the light pulse signal based on the PWM signal and converts it into a received electrical signal. The optical recovery circuit 22 recovers the PWM signal from the received electrical signal as a recovered PWM signal. The PWM decoder 23 regenerates the clock information according to rising edges of the received PWM signal. Because pulse widths of the recovered PWM signal are not used to recover the clock information, the recovered clock information is free from pulse width distortion, which is caused by the photo coupler, of the recovered PWM signal. The pulse width distortion, for example, is caused by variation of light intensity of the LED 15 and/or deterioration with time elapse of the LED 15.

To respond to a request of digital output, the PWM decoder 23 is connected to the output pads DATA and Clock. The PWM decoder 23 supplies the recovered clock signal and the decoded one-bit binary data signal for the output pads DATA and Clock, respectively. To respond to a request of an analog differential signal, the PWM decoder 23 supplies the recovered clock signal and the decoded one-bit binary data signal to the D/A converter 24. The D/A converter 24 converts the decoded one-bit binary data signal into analog converted signals (or a converted differential signal) by the use of the recovered clock signal. The output circuit 25 includes a low pass filter (not shown) and filters the analog converted signals to produce output analog signals (or an output differential signal). The output analog signals are supplied to the output pads Vout+ and Vout−.

With the above mentioned structure, the output part can receive the data with high accuracy without receiving independent clock signal from the input part. Furthermore, the predefined offset, which is the margin, of the PWM signal can be changed as far as the shorter pulse (for "0") is discriminable. Accordingly, by enlarging the margin, the discrimination of the PWM signal becomes easily and the accuracy thereof becomes higher.

Next, referring to FIGS. 5 and 6, the description will be made about an example of the DLL circuit used in the PWM decoder 23.

Figure 5:
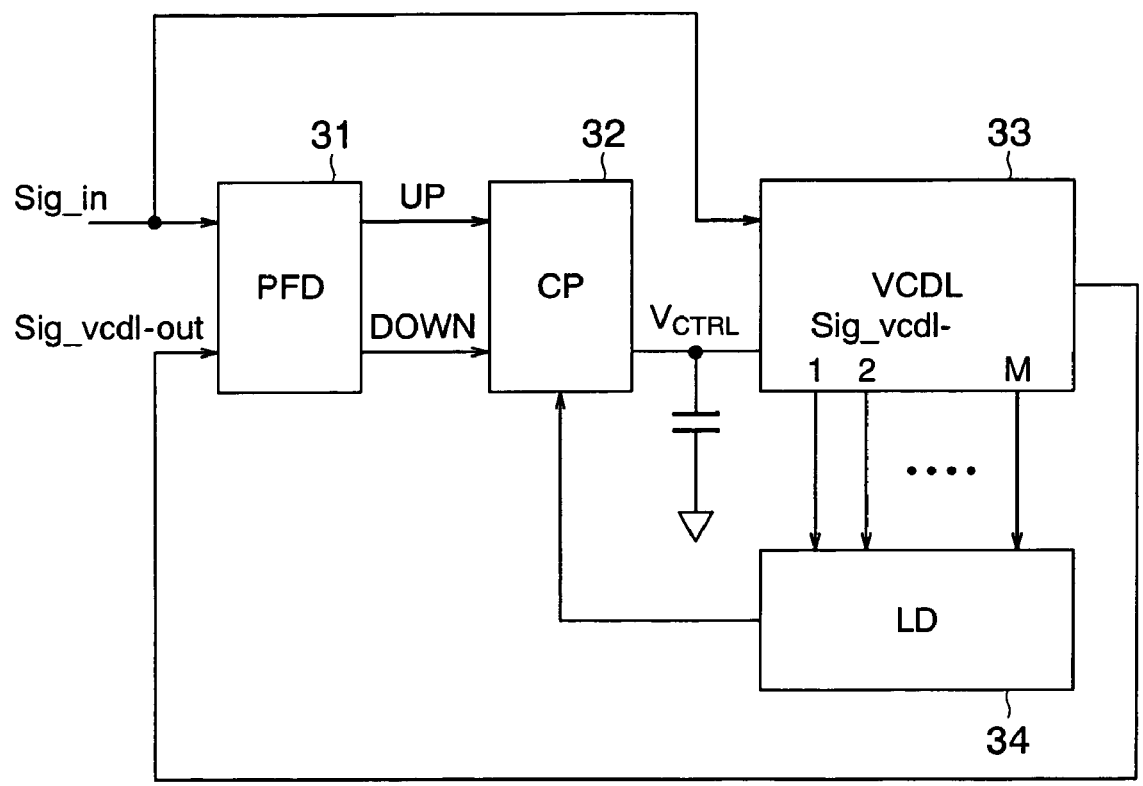
FIG. 5 is a block diagram of a delay locked loop circuit which can be used in a pulse width modulation decoder included in the optical coupled type isolation circuit of FIG. 3.

In FIG. 5, the DLL circuit includes a phase frequency detector (PFD) 31, a charge pump (CP) 32 which is connected to the PFD 31, a voltage controlled delay line (VCDL) 33 which is connected to the charge pump 32, and a lock detector (LD) 34 connected between the VCDL 33 and the CP 32.

To operate the DLL circuit, it is desirable that the input signal supplied to the DLL circuit has a duty ratio of 50%. So a frequency divider (not shown) frequency divides an input pulse signal (or the recovered PWM signal) Sig_enc by a division ratio 2 to produce a divided input signal Sig_in having the duty ratio of 50%. The input pulse signal Sig_enc and the divided input signal Sig_in are depicted at first and second rows of FIG. 6.

Figure 6:
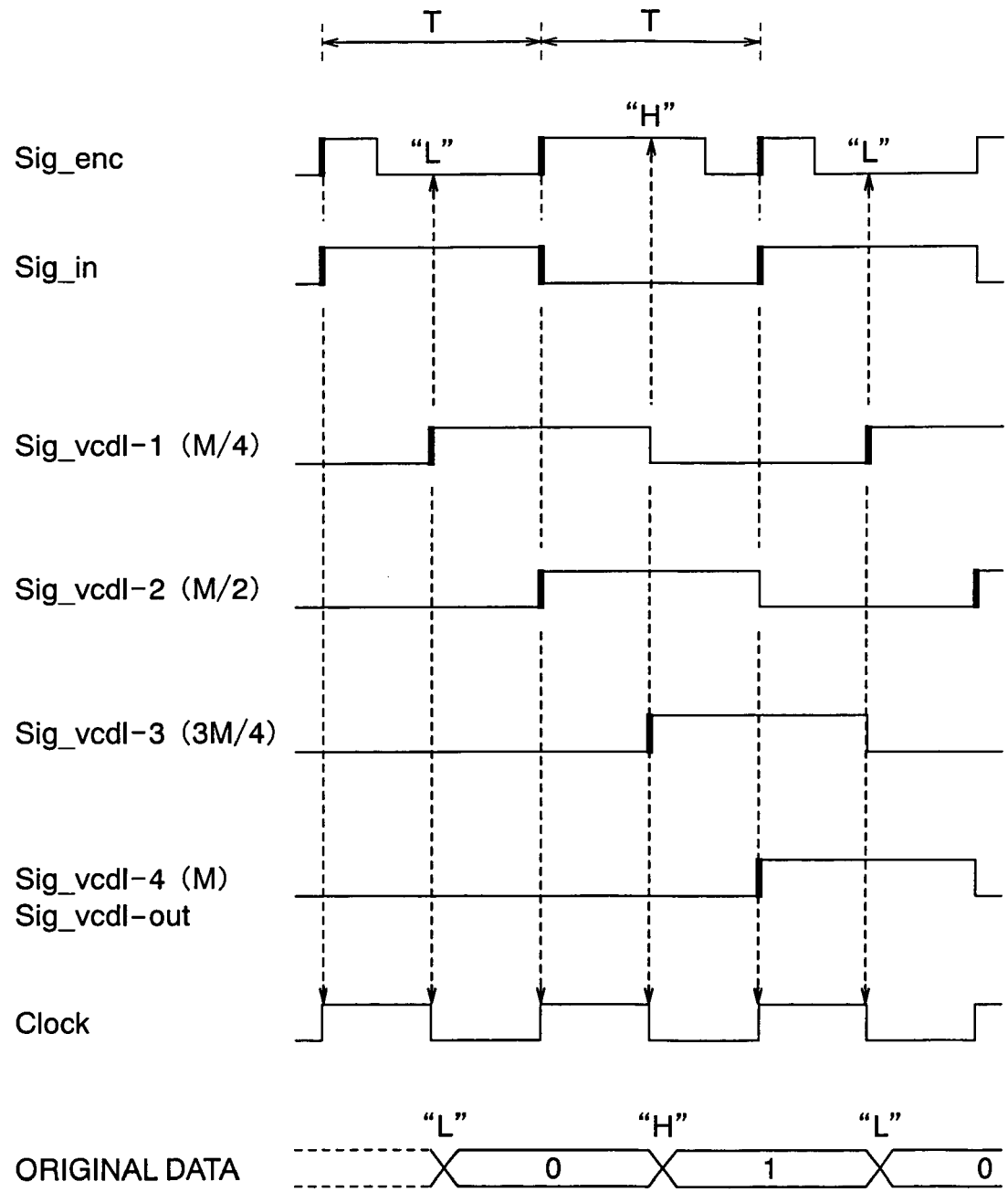
FIG. 6 is a time chart for describing an operation of the delay locked loop circuit of FIG. 5.

As illustrated in FIG. 6, the divided input signal Sig_in has a cycle of "2T" which is equal to two cycles of the input pulse signal Sig_enc. The divided input signal Sig_in is used for locking of the DLL circuit and includes information for two cycles of the input pulse signal Sig_enc.

Because the VCDL 33 includes differential delay circuits (not shown), an inverter (not shown) is used to produce a differential signal (Sig_in and Sig_in_) from the divided input signal Sig_in which is a single-ended signal. Each of the differential delay circuits consists of a differential inverter and delays the differential signal by a fixed delay time. The VCDL 33 further converts delayed differential signals delayed by the differential delay circuits to delayed single-ended signals Sig_vcdl-N (N:1, 2, . . . , M) (see third to sixth rows of FIG. 6). Here, M represents the number of the differential delay circuits (or delay stages in the VCDL 33). For instance, M is equal to four. The Nth delayed single-ended signal Sig_vcdl-M is also output as an output (or feedback) signal Sig_vcdl-out.

The PFD 31 compares the divided input signal Sig_in with the output signal Sig_vcdl-out and produces up or down signal according to the comparison result. The CP 32 produces a control voltage $V_{CTRL}$ to supply it to the VCDL 33. The PFD 31 and the CP 32 operates so that the output signal Sig_vcdl-out coincides with the divided input signal Sig_in in frequency and phase.

The LD 34 detects, by the use of the delayed single-ended signals Sig_vcdl-N, a state that the DLL circuit is locked correctly. When the delay of the VCDL 33 is too small, the LD 34 controls the CP 32 to produce the control voltage $V_{CTRL}$ which enlarges the delay of the VCDL 33 regardless of the PFD 31. To the contrary, when the delay of the VCDL 33 is too large, the LD 34 controls the CP 32 to produce the control voltage $V_{CTRL}$ which reduces the delay of the VCDL 33 regardless of the PFD 31.

In a locked state of the DLL circuit, the output signal Sig_vcdl-out coincides with the divided input signal Sig_in in frequency and phase. In the state, the output signal Sig_vcdl-out is delayed by one cycle (="2T") from the divided input signal Sig_in. Assuming that the fixed delay time of the each delay stage in the VCDL 33 is equal to "ΔT", the Nth delayed single-ended signal Sig_vcdl-N is delayed from the divided input signal Sig_in by a delay time of "ΔT×N". In the locked state, the total delay time of the VCDL 33 is equal to 2T as mentioned above while the second delayed single-ended signal Sig_vcdl (M/2) is delayed from the divided input signal Sig_in by a delay time of "T" which is a half of the total delay time of "2T".

If the rising edge of the first delayed single-ended signal Sig_vcdl-1 (M/4) is used to discriminate the input pulse signal Sig_enc, a first (or former) datum during a period corresponding to one cycle of the divided input signal Sig_in can be decoded. Similarly, if the rising edge of the third single-ended signal Sig_vcdl-3 (3M/4) is used to discriminate the input pulse signal Sig_enc, a second (or latter) datum during the period corresponding to one cycle of the divided input signal Sig_in can be decoded. The decoded data is depicted in the bottom row of FIG. 6.

Thus, the PWM decoder 23 can extract the data from the recovered PWM signal by means of the DLL circuit.

In addition, the clock signal can be recovered by synchronizing the rising edges thereof with the rising edges of the input pulse signal Sig_enc and by synchronizing the falling edges thereof with the rising edges of the first and the third delayed single-ended signals Sig_vcdl-1 (M/4) and Sig_vcdl-3 (3M/4). The recovered clock signal has a cycle of T and a duty ratio of 50% as depicted at a bottom row of FIG. 6.

Alternatively, the PWM decoder 23 may include a phase locked loop (PLL) circuit instead of the DLL circuit.

Figure 7:
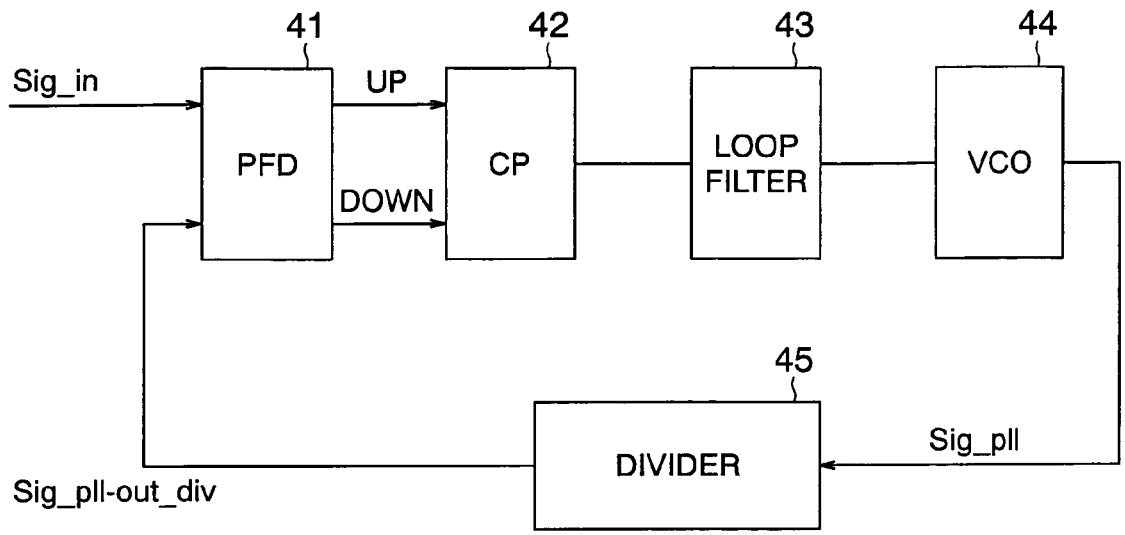
FIG. 7 is a block diagram of a phase locked loop circuit which can be used in the pulse width modulation decoder included in the optical coupled type isolation circuit of FIG. 3.
Figure 8:
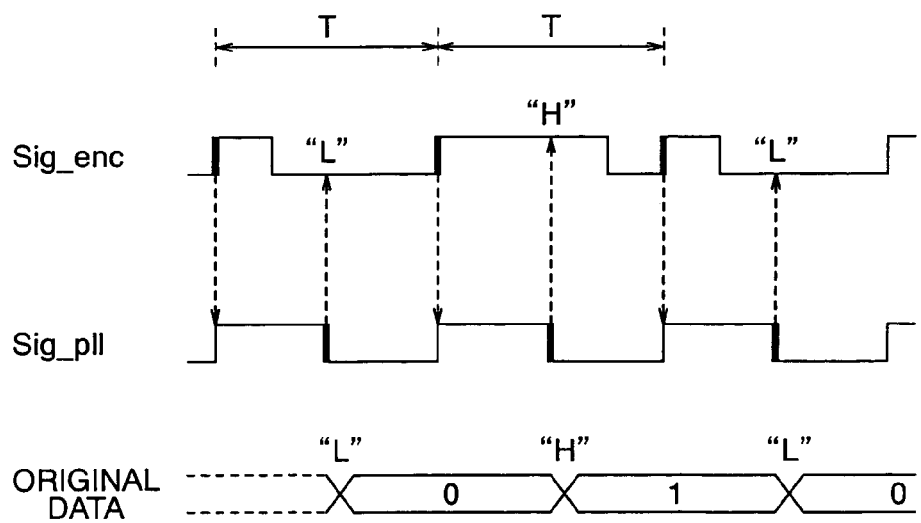
FIG. 8 is a time chart for describing an operation of the phase locked loop circuit of FIG. 7.

Referring to FIGS. 7 and 8, the PLL circuit which is usable in the PWM decoder 23 will be described soon.

In FIG. 7, the PLL circuit includes a phase frequency detector (PFD) 41, a charge pump (CP) 42 which is connected to the PFD 41, a loop filter 43 which is connected to the CP 42, a voltage controlled oscillator (VCO) 44 which is connected to the loop filter 43, and a frequency divider 45 which is connected between the VCO 44 and the divider 45.

FIG. 8 shows a time chart for describing an operation of the PLL circuit in a case where the PLL circuit has a dividing ratio of "1".

The PLL circuit operates In a well known way.

When the PLL circuit is locked to the input pulse signal Sig_enc, an output signal Sig_pll coincides with the input pulse signal Sig_enc in frequency and phase. If the falling edge of the output signal Sig_pll is used to discriminate the input pulse signal Sig_enc, a datum can be decoded as shown in FIG. 8.

Thus, the PWM decoder 23 can extract the data from the recovered PWM signal by means of the PLL circuit, Furthermore, the output signal Sig_pll corresponds to the recovered clock signal extracted from the input pulse signal Sig_enc.

According to the embodiment, the data and the clock information can be transmitted from the input part to the output part through only one channel. This is because the rising edges and the widths of the pulses are used to transmit the data and the clock information, respectively. Therefore, the output part can recover the clock signal and decode the encoded data signal. In addition, if the pulse widths and discrimination timing are properly established, required performance for the light source becomes less.

The optical coupled type isolation circuit transmits one-bit binary data at a predetermined frequency (or a period T) by the means of PWM method. Because the rising edges or the falling edges of the pulses are used to superpose the clock information, the data and the clock information are easily transmitted at the same time. In the output part, the data can be decoded by discriminating at timing of a middle of the period T. Therefore, the invention is not limited into the isolation circuit. For instance, the invention is applicable to a transmitting system that the number of the transmission channels is limited.

What is claimed is:

1. A binary data encoding circuit comprising:
   an input terminal for receiving a one-bit binary data signal;
   an encoding portion connected to said input terminal for encoding the one-bit binary data signal in a predetermined cycle T; and an output terminal connected to said encoding portion for outputting an encoded signal, wherein said encoding portion adopts a pulse width modulation method to produce two pulses which have different widths according to binary codes "0" and "1" of the one-bit binary data signal.

2. A binary data encoding circuit as claimed in claim 1, wherein a narrower one of the different widths is narrower than a half of the predetermined cycle T by a predefined offset value and a wider one of the different widths is wider than the half of the predetermined cycle T by the predefined offset value.

3. A binary data encoding circuit as claimed in claim 1, wherein a narrower one of the different widths is substantially equal to a quarter of the predetermined cycle T and a wider one of the different widths is substantially equal to three quarters of the predetermined cycle T.

4. A binary data decoding circuit for decoding an encoded signal which is obtained by encoding a one-bit binary data signal in a predetermined cycle T and by means of a pulse width modulation method, said binary data decoding circuit comprising:

an input terminal for receiving the encoded signal;
a decoding portion connected to said input terminal for decoding the encoded signal; and
an output terminal connected to said decoding portion for outputting a decoded signal,
wherein said decoding portion discriminates binary codes "0" and "1" according to a level of the encoded signal at a timing of a half of the predetermined cycle T from each rising edge of the encoded signal.

5. A binary data decoding circuit as claimed in claim 4, wherein one of the binary codes "0" and "1" is represented by a narrower pulse of the encoded signal that is narrower than the half of the predetermined cycle T and the other is represented by a wider pulse of the encoded signal that is wider than the half of the predetermined cycle T.

6. An optical coupled type isolation circuit comprising:

a sigma-delta analog-digital converter for converting an input analog signal into a one-bit binary data signal;
an encoder connected to said sigma-delta analog-digital converter for encoding the one-bit binary data signal to produce a pulse width modulation signal which has a predetermined pulse width in accordance with the one-bit binary data signal and is synchronized with a clock signal for the sigma-delta analog-digital converter;
a light emitting device connected to said encoder for producing a light pulse signal according to said pulse width modulation signal;
a light detector optically coupled with said light emitting device for receiving the light pulse signal from said light emitting device to produce a received electrical signal;
an optical recovery circuit connected to said light detector for recovering the pulse width modulation signal from the received electrical signal to produce a recovered pulse width modulated signal; and
a decoder connected to said optical recovery circuit for decoding the recovered pulse width modulation signal to produce a decoded one-bit binary data signal and a recovery clock signal.

7. An optical coupled type isolation circuit as claimed in claim 6,
wherein the pulse width modulation signal includes two pulses for representing binary codes "0" and "1", and
wherein one of the pulses has a narrower width narrower than a half of a clock cycle of the clock signal by a predetermined offset value while the other has a wider width wider than a half of the clock cycle by the predetermined offset value.

8. An optical coupled type isolation circuit as claimed in claim 7, wherein said decoder discriminates binary codes "0" and "1" according to a level of the pulse width modulation signal at a timing of a half of the clock cycle from each rising edge of the pulse width modulation signal.

9. An optical coupled type isolation circuit as claimed in claim 8, wherein said decoder includes a delay locked loop circuit which operates in synchronization with rising edges of the pulse width modulation signal and defines the timing.

10. An optical coupled type isolation circuit as claimed in claim 6, further comprising:

a sigma-delta digital-analog converter connected to said decoder for converting the decoded one-bit binary data signal into a converted analog signal, and
an analog filter connected to said sigma-delta digital-analog converter for filtering the converted analog signal to produce a filtered analog signal.

* * * * *